Nov. 3, 1959 C. D. NESTLERODE ET AL 2,911,530

TELEVISION TUNER

Filed May 6, 1957

INVENTORS
CLIFFORD DALE NESTLERODE
DAVID COAN FELT
BY
Darby & Darby
ATTORNEYS

United States Patent Office 2,911,530

Patented Nov. 3, 1959

2,911,530

TELEVISION TUNER

Clifford Dale Nestlerode, Packanack Lake, and David Coan Felt, Bergenfield, N.J., assignors to Allen B. Du Mont Laboratories, Inc., Clifton, N.J., a corporation of Delaware Application May 6, 1957, Serial No. 657,438

4 Claims. (Cl. 250—40)

Figure 1:
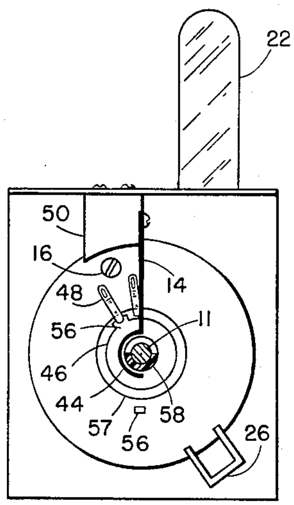

This invention relates to television tuners and more particularly to a novel switch type tuner featuring individual oscillator tracking adjustments for each television channel.

In the present day television tuner art, there are generally two types of tuners. One is known as a continuous tuner and the other is usually referred to as a "detent" type tuner. The detent tuner differs mechanically from the continuous tuner in that a coil switching mechanism is used when changing from one television channel to another.

The "detent" type tuner is further subdivided into the turret type tuner and the switch type tuner. Both of these tuners require antenna coils, RF amplifier plate coils, mixer grid coils and oscillator coils. However, the turret tuner distinguishes over the switch tuner by switching complete sets of coils when changing television channels. That is, each television channel has its own antenna, RF amplifier, grid and oscillator coils. The switch tuner distinguishes over the turret tuner in that the oscillator coils, for example, are made up of a group of coils in series arrangement. Changing from one television channel to another is accomplished by either shorting out a selected number of coils or in some other way using only a portion of the coils whose inductance is sufficient to tune the oscillator over a given range.

The advantages of a switch tuner over a turret tuner and vice versa are myriad. However, the discussion here will concern itself with the more obvious advantages.

The turret tuner is usually made in the form of two drums end to end on a common shaft. Each drum has longitudinally disposed compartments arranged around the periphery of the drum, each compartment containing the necessary coils for a given television channel. The reason for the two drums is to separate the antenna coils from the remaining coils. In an arrangement such as this, the distinct advantage resides in the fact that each oscillator coil can be tuned independently of all the others. Also, replacing a defective coil in a turret tuner merely requires that the defective coils associated with any given channel be removed from its compartment and operative coils placed therein.

However, on the debit side of the ledger, a turret tuner is usually very expensive to fabricate and because of the many contacts necessary for individual coil switching the tendency is to have dirt and grime collect on the contacts. These dirty contacts create a noise disturbance when switching from one channel to another and sometimes require further manipulating when in position to bring clean contact portions to the contactors. In addition, there are about eleven or twelve individual contacts that must be made to bring all the coils into the circuit. Therefore, the problem of lining up all eleven contacts in a turret tuner for eleven television channels plus a UHF channel may be very difficult, time-consuming, and in some instances, inaccurate.

On the other hand, the switch tuner is made of a series of wafers on a common shaft. The antenna coils are mounted on one wafer, the RF amplifier plate coils are mounted on another wafer, the mixer grid coils are mounted on still another wafer and the oscillator coils are mounted on the last wafer. The oscillator coils are usually placed in series arrangement about the circumference of the wafer, with each coil terminating in a contact point. To change from one channel to another, requires a rotating contactor to contact one coil of the series string, while one end of the string is connected directly to the oscillator circuit. In this manner, a group of coils is chosen rather than individual coils.

Since the individual coils are in series, oscillator tracking is sometimes very difficult. Usually, there is only one tracking adjustment for the low band (channels 2–6 inclusive) and one tracking adjustment for the high band (channels 7–13 inclusive). If, for example, the group of coils chosen for channel 4 operation cannot bring the oscillator to the exact frequency desired, the low band oscillator tracking adjustment must be retuned. Since all oscillator coils are in series, retuning the oscillator coil for proper operation of channel 4 results in a slight misalignment of the oscillator coils for operation on channels 2, 3, 5 and 6. Similarly, the high band suffers from the same defect and it is obvious that the oscillator tracking adjustment in this type of tuner represents a compromise. Additionally, if any one coil in the series string were to become defective the whole wafer would have to be replaced which, in some instances, requires that the tuner be sent back to the factory for replacement.

On the other hand, the switch tuner has the distinct advantage of being much easier to fabricate and less expensive. In addition, the switch tuner has a single contact that is always used in switching from one channel to another and the inherent wiping action tends to keep this contact cleaner than the turret type contact.

The present invention represents an improvement on both the turret and switch type tuners above referred to, in that it provides in a switch tuner, separate and independent oscillator tracking adjustments which make for easy and perfect oscillator tracking. These advantages are achieved by providing a plurality of tunable oscillator coils disposed around the circumference of a switch tuner wafer and selectable by rotating the wafer.

It is therefore an important object of this invention to provide a switch tuner having independent and increased range oscillator frequency adjustments.

Another object of the present invention is to provide a switch tuner which allows the setup of individual channels for local conditions on one channel and fringe conditions on another channel.

Still another object of this invention is to provide a switch tuner featuring ease of field adjustment of the oscillator coil thereby eliminating the servicemen's main objection to switch tuners.

A further object of this invention is to provide a switch tuner that easily complies with the Federal Communications Commission radiation limits, regardless of the location of the tuner in a television receiver.

A still further object of this invention is to provide a switch tuner that is less expensive to fabricate than the tuner presently being manufactured.

The features of our invention which we believe to be novel, are set forth with particularity in the appended claims. The invention itself, however, both as to its organization and method of operation, together with further objects and advantages thereof, may best be understood by referring to the following description taken in conjunction with the accompanying drawing in which, Figs. 1 and 2 represent an end view and side view respectively of an embodiment of our invention; and Figs. 3, 4 and 5 represent still another embodiment of a modification of the vernier tuning mechanism.

Figure 2:
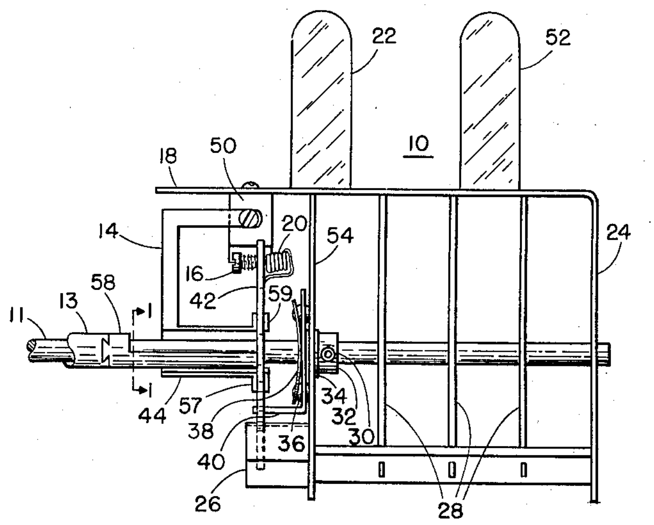
Figures 3, 4, 5:
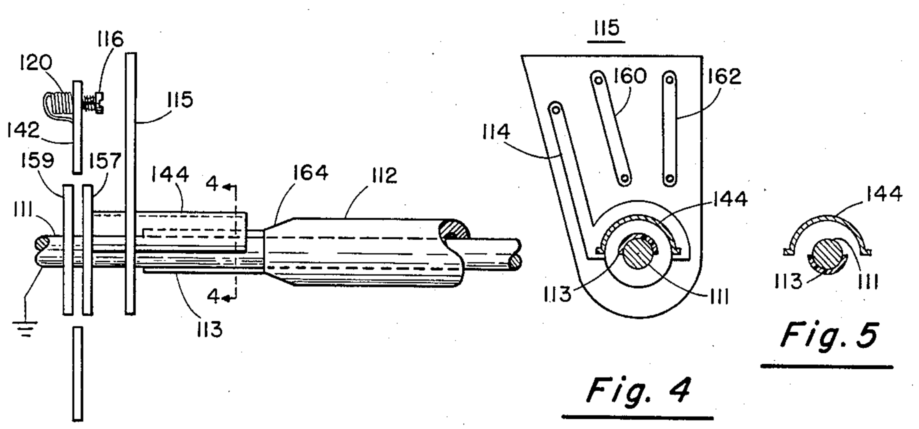

Referring now to Figs. 1 and 2, chassis 10 is shown divided into two sections. Front section 18 contains the oscillator circuitry associated with stage 22 while rear section 24 contains the remainder of the tuner stages including the RF amplifier circuitry for stage 52 and the circuitry for the mixer stage. Tube 22 is the usual triode pentode in a single envelope wherein the triode section is used as the oscillator and the pentode section is used as the mixer and may be, for example, the type designated as 6AT8 or 6U8. Metal partition 54 shields the mixer circuitry from the oscillator circuitry and serves the additional function of having the detent depressions embossed thereon.

The detent mechanism is placed on partition 54 at the rear of the oscillator section and consists of a detent spring 38, ball or roller 36 and hub 32 with set screw 30 serving to affix the detent mechanism to main shaft 11. In addition, the detent mechanism is forced against partition 54 by retaining ring 34.

The oscillator switching assembly consists of two portions. The first or rotary portion is a flat, plastic disk 42 having a central aperture and having a multiplicity of oscillator coils 20 disposed about the periphery thereof. One end of each of coils 20 terminates in a contact 48 on one side of disk 42 while the other end of each of coils 20 terminates in a similar contact (not shown) on the other side of disk 42. Tuning slugs 16, having a slot in one end, are threaded through disk 42 into coils 20 to vary the inductance thereof. In this instance, slugs 16 are made of brass although it should be obvious to those skilled in the art that any one of a number of materials can be used to effectively vary the inductance of coils 20.

The second or stationary portion of the oscillator switch assembly consists of a center portion 57 which is mounted in the aperture of disk 42 and on which is mounted contact 46 having a knife portion 56 for contacting contacts 48. On the rear surface 59 of portion 57 is a contact and knife portion (not shown) similar to contact and knife portions 46 and 56, for contacting the contacts connected to the other end of coils 20. Rotatable disk 42 is stabilized in this instance by the slotted plastic block 50 mounted on chassis 10 and by a slotted extension of the wafer retaining bracket 26. Another means for stabilizing disk 42 would be to have tabs extending from partition 54 to contact the rear surface of disk 42 and a plurality of spring-like fingers also extending from partition 54 and contacting the other surface of disk 42 at a point immediately adjacent the tab sections. This would obviate the need for the slotted plastic block 50 and extension 26.

Rotation of disk 42 is achieved by arm 40 which has one end affixed to shaft 11 immediately adjacent detent 32 and its other end affixed to and passing through slot 60 in disk 42.

Contact member 46 is mounted on shaft 11 for rotation relative thereto and is maintained stationary at all times, its rotation being prevented by the semicylindrical vernier capacitor plate 44, a flat extension 14 of which is attached to the capacitor plate at one end and to plastic block 50 at the other end. It will thus be seen, that when channel selector shaft 11 is rotated, arm 40 simultaneously rotates disk 42 bringing individual oscillator coils 20 into the oscillator circuit through knife contact 46. Thus, each coil is completely independent of its adjacent coil and therefore the inductance can be varied without effecting the inductance of either its adjacent coil or any of the other coils in either the low or high band.

The remainder of the tuner, rear section 24, comprises the antenna, RF amplifier, and mixer circuitry. Each stage has its associated circuit elements mounted on standard switch sections or wafers 28. Each wafer is affixed between mounting bracket 26 and the upper portion of the chassis for mechanical stability. Also by the simple expedient of loosening set screw 30, channel selector shaft 11 may be removed from the wafers thereby facilitating the removal of any one of wafer 28 or more particularly wafer 42.

In addition to the above mentioned features of our invention, another important feature resides in the particular vernier tuning capacitor. In the embodiment of Figs. 1 and 2, the vernier tuning capacitor consists of channel selector shaft 11, dielectric material 58 and capacitor plate 44. Vernier tuning mechanism 12 is a hollow shaft disposed about channel selector shaft 11 and is made of two sections, namely, metallic section 13 and plastic section 58. These two sections may either be cemented together or may be locked together in any one of a number of appropriate ways. At one end 180° of the circumference of plastic section 58 is removed and this end is placed adjacent capacitor plate 44 so that when vernier tuning mechanism 12 is rotated, the dielectric constant between plate 44 and shaft 11 is varied thereby varying the capacitance between capacitor plate 44 and shaft 11. Since shaft 11 is at ground potential, rotating vernier tuning mechanism 12 varies the capacitance between plate 44 and ground.

In Figs. 3, 4 and 5, another embodiment of the vernier tuning mechanism is shown. In this embodiment, capacitor plate 144 is mounted on plastic board 115 and is electrically connected to the appropriate portion of the oscillator circuit through printed wiring 114. The upper end of board 115, although not shown, is affixed to the upper portion of chassis 18 (Fig. 1) for mechanical stability. Capacitor plate 144 extends through board 115 to switch sections 157 and 159 to prevent the rotation thereof. Switch sections 157 and 159 correspond identically in structure and function with sections 57 and 59 respectively of Figs. 1 and 2. As described in connection with Figs. 1 and 2, front and rear switch sections 157 and 159 have contacts with knife portions thereon (not shown) for contacting each end of oscillator coils 120. Leads from the knife portion mounted on switch sections 159 and 157 are brought to their respective circuits through a wire (not shown) from the switch sections to printed wiring 160 and 162 respectively mounted on board 115. For simplicity of presentation the detent mechanism and connecting arm 40 of Figs. 1 and 2 are not shown in this embodiment. However, it should be understood that their presence here is required. The vernier tuning mechanism 112 is a hollow metal shaft disposed about control shaft 111. In this embodiment, vernier mechanism 112 has a necked-down portion 164 to form the variable vernier tuning portion 113. Thus, the variable portion 113 of the capacitor assembly is free to rotate in the air space between shaft 111 and capacitor plate 144 to effectively vary the thickness of the air dielectric between shaft 111 and plate 144. This effectively varies the capacitance between capacitor plate 144 and ground since shaft 111 is at ground potential.

Figs. 4 and 5 show variable capacitance 113 in maximum and minimum capacitance positions respectively while Fig. 3 depicts a variable capacitor 113 in a median capacitance position.

It is also obvious that the outer diameter of section 113 may be appropriately selected to obtain the desired range of capacitance variation.

While there has been described what are presently considered preferred embodiments of the invention, it will be obvious to those skilled in the art that various changes and modifications may be made therein without departing from the inventive concept, and it is aimed in the appended claims to cover all such changes and modifications as fall within the true spirit and scope of the invention.

What is claimed is:

1. A switch type television tuner comprising a chassis, a rotatable main tuning shaft, a plurality of wafer means affixed to said chassis each having circuit tuning coils mounted thereon, each of said coils corresponding to individual television channel circuits and each of said coils terminating in contacts, an equal plurality of switch means mounted on said shaft and rotatable therewith, said switch means contacting selected ones of said plurality of coil contacts for insertion into said television circuit, an equal plurality of tunable oscillator coils mounted on a rotatable wafer, each end of each oscillator coil terminating in a contact, a fixedly positioned switch means having a vernier tuning capacitor plate affixed thereto, said oscillator coil wafer coupled to said main tuning shaft for rotation therewith about said fixedly positioned switch means whereby the contacts of said selected oscillator coil contact said fixedly positioned switch means to insert said selected oscillator coil into said television circuit when said main tuning shaft is rotated, a hollow tube disposed about said main tuning shaft and having a projection adjacent said vernier capacitor plate, said projection being integral with said hollow tube, dielectric material between said shaft and said vernier capacitor plate and means rotating said projection to vary the amount of dielectric between said shaft and said vernier capacitor plate.

2. The device of claim 1 wherein said projection comprises a hollow metallic semicylinder complementing the configuration of said shaft and said projection, a half-round semicylinder complementing the configuration of said vernier capacitor plate.

3. The device of claim 2 wherein said dielectric material is a high dielectric plastic.

4. The device of claim 2 wherein said dielectric is air.

References Cited in the file of this patent

UNITED STATES PATENTS

| | | |
|---|---|---|
| 2,535,686 | Lawrence | Dec. 26, 1950 |
| 2,557,234 | Reith | June 19, 1951 |
| 2,620,378 | Thias | Dec. 21, 1952 |
| 2,698,388 | Cage | Dec. 28, 1954 |
| 2,810,827 | Nordby | Oct. 22, 1957 |
| 2,811,637 | O'Brien | Oct. 29, 1957 |
| 2,826,697 | Friberg | Mar. 11, 1958 |